United States Patent [19]
Lee et al.

[11] Patent Number: 5,226,005
[45] Date of Patent: Jul. 6, 1993

[54] DUAL PORTED CONTENT ADDRESSABLE MEMORY CELL AND ARRAY

[75] Inventors: David C. Lee, San Diego; Jeffery L. Easley, Carlsbad; Ashgar K. Malik, Escondido, all of Calif.

[73] Assignee: Unisys Corporation, Blue Bell, Pa.

[21] Appl. No.: 615,941

[22] Filed: Nov. 19, 1990

[51] Int. Cl.$^5$ .............................................. G11C 15/00
[52] U.S. Cl. .................. 365/49; 365/189.07; 365/230.05
[58] Field of Search ............... 365/49, 230.05, 189.07

[56] References Cited

U.S. PATENT DOCUMENTS

| | | | |
|---|---|---|---|
| 3,633,182 | 1/1972 | Koo | 365/49 |
| 3,863,232 | 1/1975 | Johnson et al. | 365/49 |
| 4,779,226 | 10/1988 | Haraszti | 365/49 |
| 4,831,585 | 5/1989 | Wade et al. | 365/49 |
| 4,862,412 | 8/1989 | Fried et al. | 365/189.07 X |
| 5,111,427 | 5/1992 | Kobayashi et al. | 365/49 |
| 5,130,945 | 7/1992 | Hamamoto et al. | 365/49 |

Primary Examiner—Eugene R. LaRoche
Assistant Examiner—Do Hyun Yoo
Attorney, Agent, or Firm—Alfred W. Kozak; Mark T. Starr

[57] ABSTRACT

An improved CAM (content addressable memory) cell is provided with dual address lines operable independently for a Read operation or for a Write operation. The cell is additionally provided with dual ports so that the first port permits a data input for Write operations or alternatively a data input for Search-Compare operations. The second port (Data Output) is independently connected to enable Read out of data residing in the cell. Each CAM cell also has a coincidence line (match-hit) output to indicate when an input Search bit or word coincides with resident data within the CAM cell. The CAM cells are arranged in an array of "m" rows with each row having "n" bits to hold a "n" bit word. Operationally the array permits both "Read" and "Search-Compare" operations to be accomplished in one clock cycle rather than the usual requirement of 3-4 clock cycles.

10 Claims, 7 Drawing Sheets

SEARCH OPERATION

READ OPERATION

DUAL PORTED CONTENT ADDRESSABLE MEMORY CELL AND ARRAY

FIELD OF THE INVENTION

This disclosure pertains to content addressable memories which can execute a search-compare operation in conjunction with a Read operation in the same clock cycle.

BACKGROUND OF THE INVENTION

A key feature in the use of computer systems is an available memory which can provide the requisite data needed by the processing unit in the system. A special application of memory is used in many computer systems which provide a cache memory unit which is closely associated with the central processing unit (CPU) in order to provide frequently used memory data rapidly to the CPU without requiring the added delay of having to address and access the main memory unit.

The content addressable memory or CAM is a structure which uses associative memory circuits in order to do memory searches.

The conventional content addressable memory is generally constructed in very large scale integrated circuits (VLSI) by using a memory latch coupled with a comparison circuit. Such a content addressable memory (CAM) is used to perform certain basic operations such as:

(a) Write operation: where data is store individual memory addresses of the content addressable memory by a sequential writing of the data.

(b) Search Operation: Where a pattern of search data is input to all of the locations in the content addressable memory and all locations are compared simultaneously in parallel with the search data. If a certain location identically "matches" the input search data, then an output signal will indicate the match condition and the "address" of the matched data which was located in the Content Addressable Memory.

The content addressable memory circuitry has many applications often in cache designs where it is desired to store recently used memory addresses in combination with the associated data that corresponds to these addresses. These associated data are stored locally near the processor in a random access memory (RAM). Thus the CAM can store a recently used data address which then can be used to point to a local memory location (in RAM) holding the associated data. When the CAM search results in a "match", then faster access to the local storage RAM is performed instead of the longer time and slower fetch period required to access the main memory.

Figure 1A:
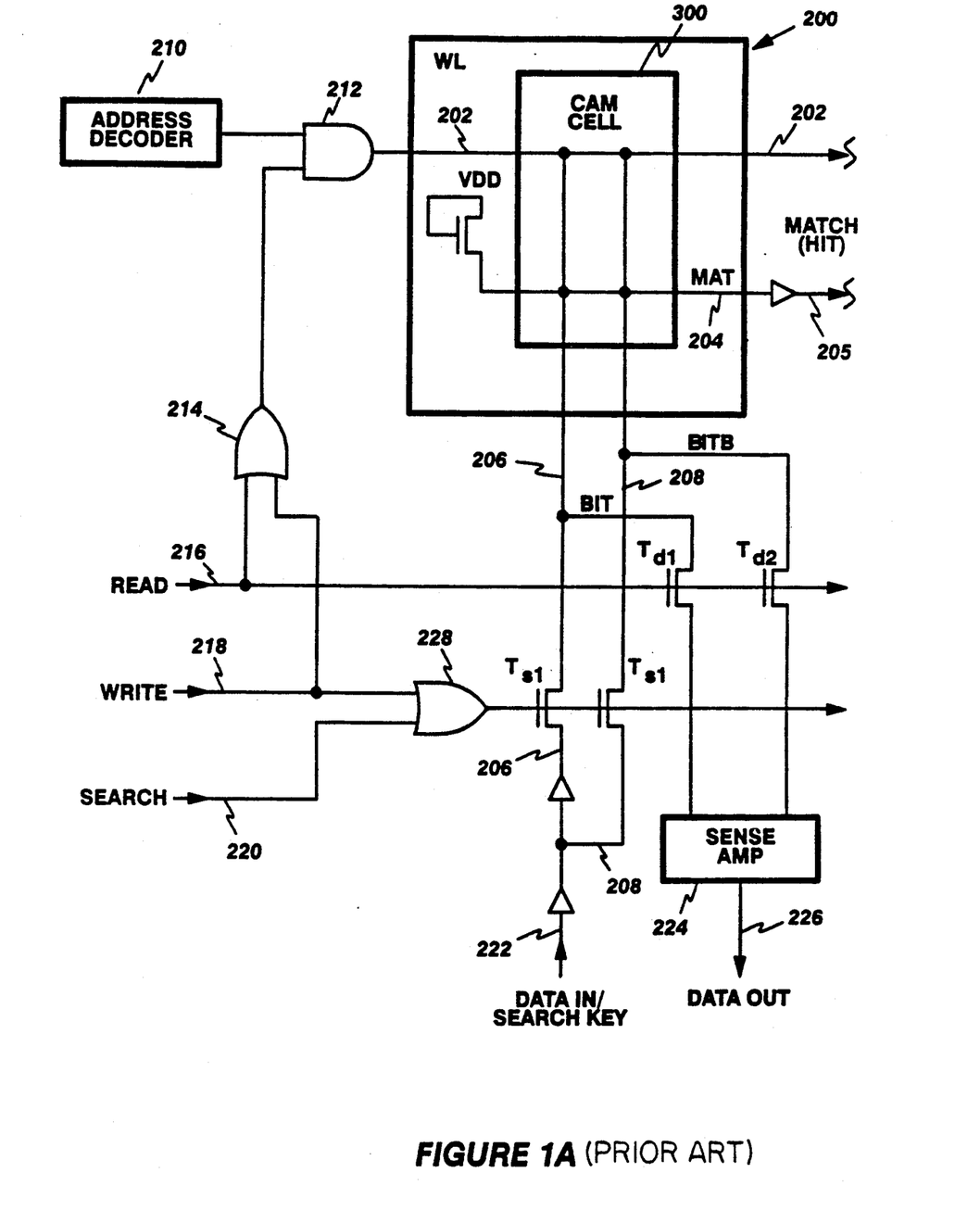
FIG. 1A is a diagram of a schematic diagram of a conventional content address memory.
Figure 1B:
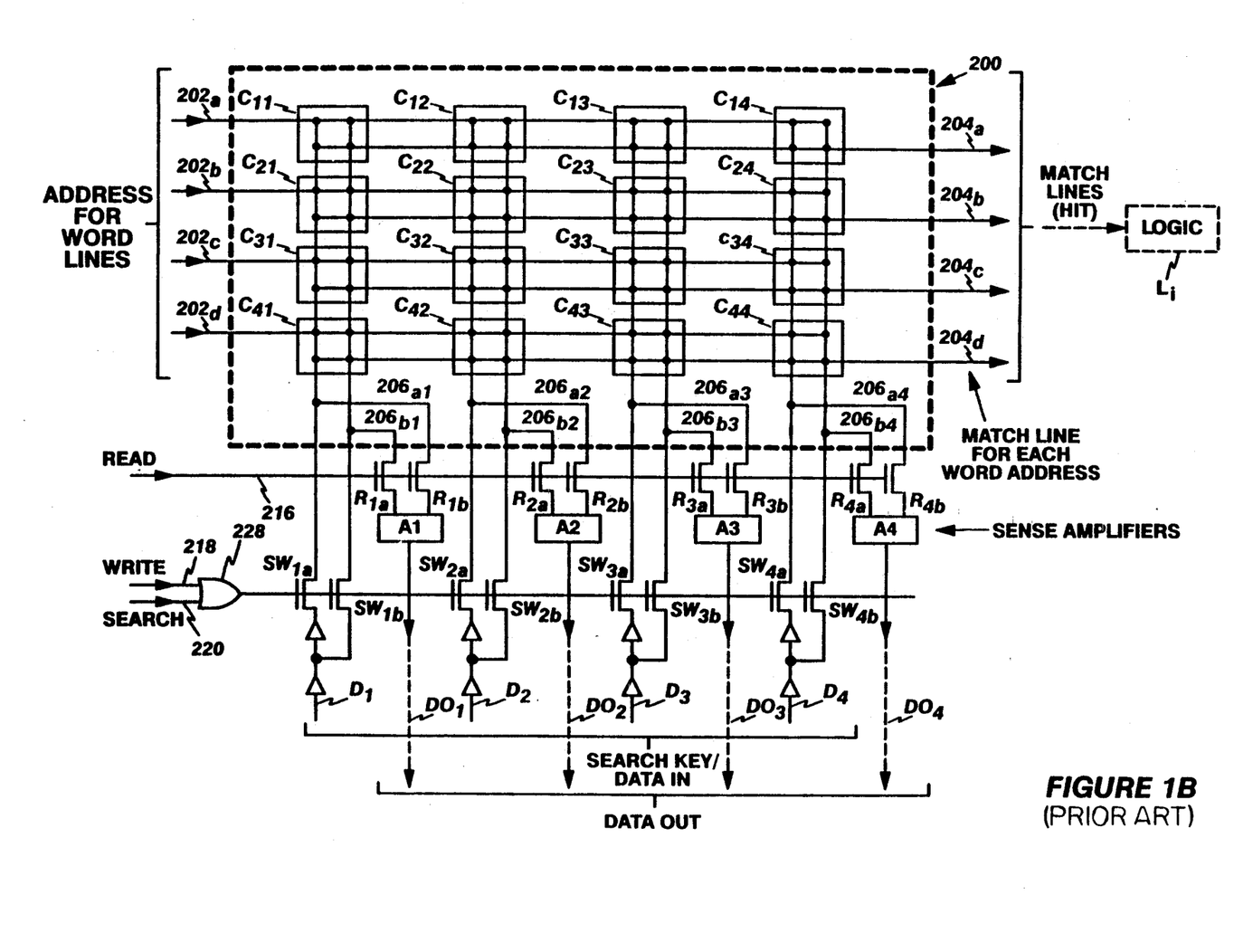
FIG. 1B is an illustrative CAM array showing a typical 4×4 CAM array.
Figure 2:
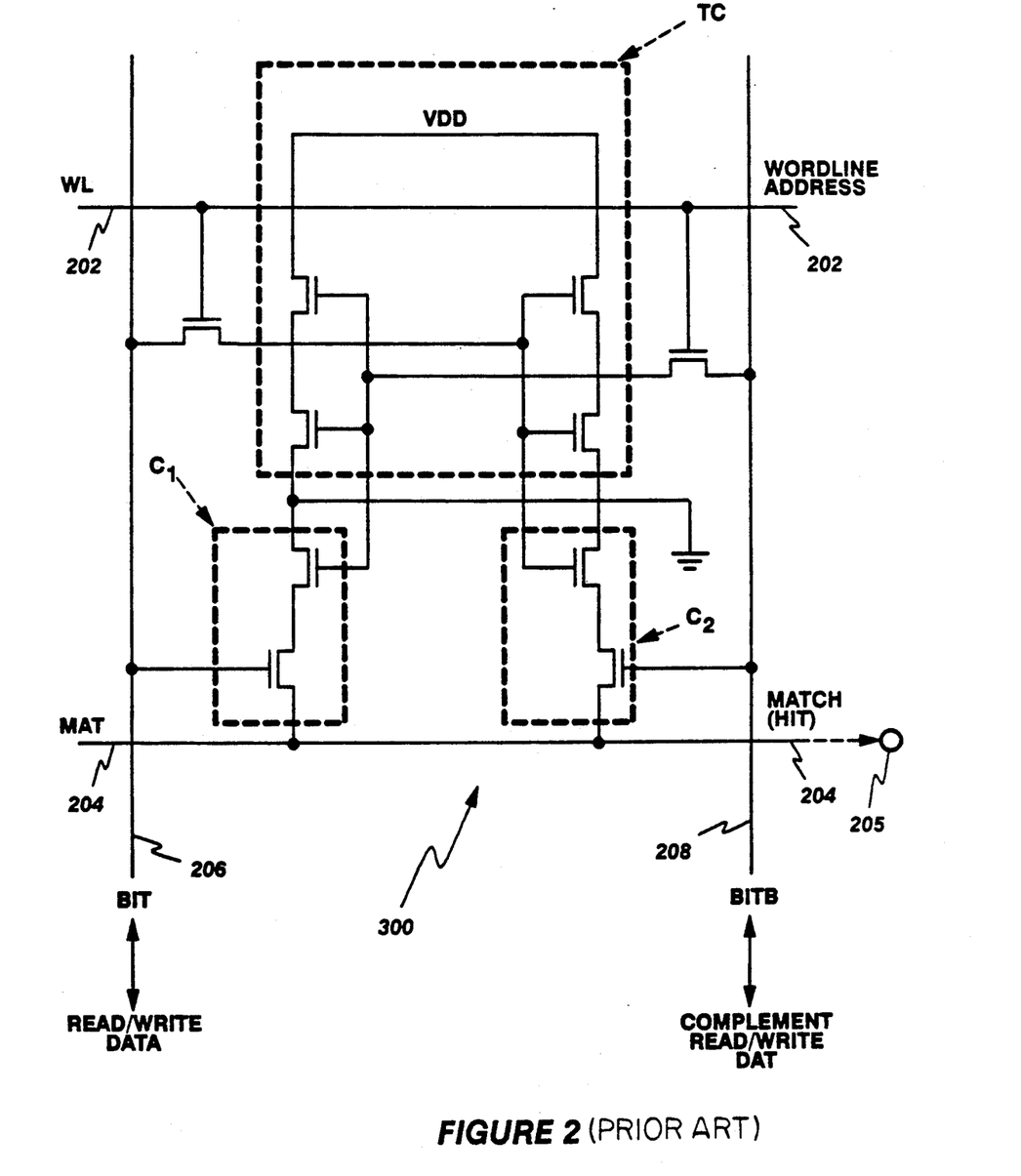
FIG. 2 is a schematic drawing showing the transistors and connecting lines of a single conventional content addressable memory cell.

FIG. 1A shows a typically standard content addressable memory in block diagram form. The content addressable memory CAM 200 is a latticed array composed of CAM cells 300. A diagram of the format of the conventional CAM cell 300 is shown in FIG. 2. FIG. 1B illustrates a 4×4 array of CAM cells forming a CAM.

Referring to FIG. 1, even though there is a multiple number of lattices of CAM cells 300 in the content addressable memory 200, for ease of explanation FIG. 1A is used to show how each one of the CAM cells is connected and operated.

The CAM cell 300 (as one example of the many CAM cells involved) is provided with a word line 202 which carries an address. As seen in FIG. 1B, there is a word address line $202_a$–$202_d$ for each row of CAM cells (which carry a data word). Also the CAM cell 300 has a match "hit" line 204 which exits through a first output 205 in FIG. 1A.

Likewise in FIG. 1B, a set of hit lines $204_a$–$204_d$ exits from each row of CAM cells. The search key/data-in is a set of digital input lines in FIG. 1A and represented by line 222, FIG. 1A, and which are applied, after splitting, by means of inversion, into bit line 206 and bit line 208, FIG. 1A, to provide an input to the CAM 300 (and all of the other CAM cells involved) in a given row. In FIG. 1B these inputs are shown as D1, D2, D3, D4.

The "search" is initiated by an activator signal on line 220, FIGS. 1A, 1B, through the OR gate 228 which also has an input from the Write activating signal 218, FIG. 1B.

The Read signal on line 216 FIG. 1A is used to activate Transistors $Td_1$ and $Td_2$ in order to enable the sense amplifier 224 to output data on line 226. The Read activating line 216, FIG. 1A, is also seen to feed into OR gate 214 whose output is then sent as one input to the AND gate 212. The address decoder 210 provides address data input into AND gate 212 which provides for selection of the word line 202.

The OR gate 228, FIG. 1A, receives inputs from the Write line 218 and from the Search activating line 220 such that only one of these lines 218 and 220 will activate the output of the OR gate 228.

The Search activating line 220, FIG. 1A, when operative through the OR gate 228 will activate the transistors $Ts_1$ and $Ts_2$ so that the search key data may enter on the data-in line 222 and be conveyed on the bit lines 206 and 208 up to the CAM cell 300.

FIG. 1B is a more detailed view of FIG. 1A in order to indicate how line 202 of FIG. 1A is really a group of word lines $202_a$, $202_b$, $202_c$, $202_d$, in FIG. 1B. Likewise the Data In/Search Key line 222 of FIG. 1A is actually a set of multiple lines $D_1$, $D_2$, $D_3$, $D_4$ of FIG. 1B.

The conventional CAM block diagram of FIG. 1A is expressed only in schematic form since there are a multiplicity of the CAM cells 300 and there is also a multiplicity of input address lines, data input/search key lines and also a multiplicity of data output lines. Thus with reference to FIG. 1B, there is indicated a more realistic representation of a conventional content addressable memory or CAM.

As seen in FIG. 1B, there is provided an array of CAM cells such that the first row of CAM cells are designated C11, C12, C13, and C14. This represents the cell positioning in row 1 and the sequence in the CAM array to show which numbered position in the cell rests.

Likewise the second row of CAM cells is designated C21, C22, C23, C24 which last unit represents the CAM cell in the second row and in the fourth column.

In FIG. 1B, there are a series of word address line inputs designated $202_a$, $202_b$, $202_c$, and $202_d$. Each of these lines is an address input which can access one row of CAM cells. Thus if line $202_b$ is being activated, it will access the CAM cells C21, C22, C23, C24 which represents 4 bits of data holding a 4 bit word.

Likewise in FIG. 1B there are seen a set of "match" lines designated $204_a$, $204_b$, $204_c$, and $204_d$. Each of these lines is an output line which represents the first word in the first row, the second word in the second row, the third word in the third row, and the fourth word in the fourth row such that when one of these match lines is activated, it indicates that the particular data bit word (4 bit word) in that particular row has been matched by input search-key data which has been applied to the input lines $D_1$, $D_2$, $D_3$, and $D_4$. Thus if the input lines $D_1$ through $D_4$ should represent the bits 1001, and if the same data of 1001 is also residing in the second row of CAM cells (C21 through C24) then there is a match or "hit" which is accomplished so that the output line $204_b$ will be activated and will convey a signal to the logic unit $L_i$ which will tell the logic unit which particular address was found to contain the data that matched the input lines $D_1$, $D_2$, $D_3$, and $D_4$.

With reference to FIG. 1B, there is seen a Read line 216 which is used to activate a set of 4 groups of transistors designated R1$a$, R1$b$, R2$a$, R2$b$, R3$a$, R3$b$, and R4$a$, R4$b$. These transistors are activated by the Read line 216 so that if an address for the word line $202_c$ is activated, then residing in cells $C_{31}$, $C_{32}$, $C_{33}$, $C_{34}$ will be transmitted through the sense Amplifiers $A_1$, $A_2$, $A_3$, $A_4$ to the Data Out lines DO1, DO2, DO3 and DO4.

Referring to FIG. 1B, it is seen that each "column" of CAM cells will have a "pair" of output lines (which pass through the Read line transistors $R_1a$, $R_1b$) for example, which connect to the output lines $206_{a1}$ and $206_{b1}$ which are the output lines for the first column of CAM cells. Then for example if the address line $202_b$ activates the second row of CAM cells, then the data in these 4 CAM cells (C21, C22, C23, C24) will be passed down through their Read output lines $206_{a1}$ and $206_{b1}$; $206_{a2}$, and $206\ b2$; $206_{a3}$, and $206_{b3}$; and $206_{a4}$ and $206_{b4}$.

Due to the activation of the transistors R1$a,b$ R2$a,b$ R3$a,b$ and R4$a,b$ the output data signals will pass through the sense amplifiers A1, A2, A3, A4 in order to provide the data out signal on lines DO1, DO2, DO3, DO4.

The chief operating function of the content addressable memory (CAM) is the ability to search the data in the various rows of words, which in this example of FIG. 1B shows that there are 4 rows of words and each word has a content of 4 bits. Thus using the search-key input lines D1, D2, D3, and D4 and enabling the transistors SW for each of the columns, the bit data on lines D1 through D4 will be transmitted up through each column of the series of data words in the content addressable memory 200. Then, for example, if the input data on lines D1 through D4 should be the digital number 0110 and if it was found that the data in the third row of CAM cells matched this, that is to say the data in that row was 0110, then the match or hit line $204_c$ would be activated in order to send a signal to the logic $L_1$ which would indicate that the address residing in the third word line, that is to say, row 3 of CAM cells C31 through C34, is the address being read out on lines DO1 through DO4.

Figure 3:
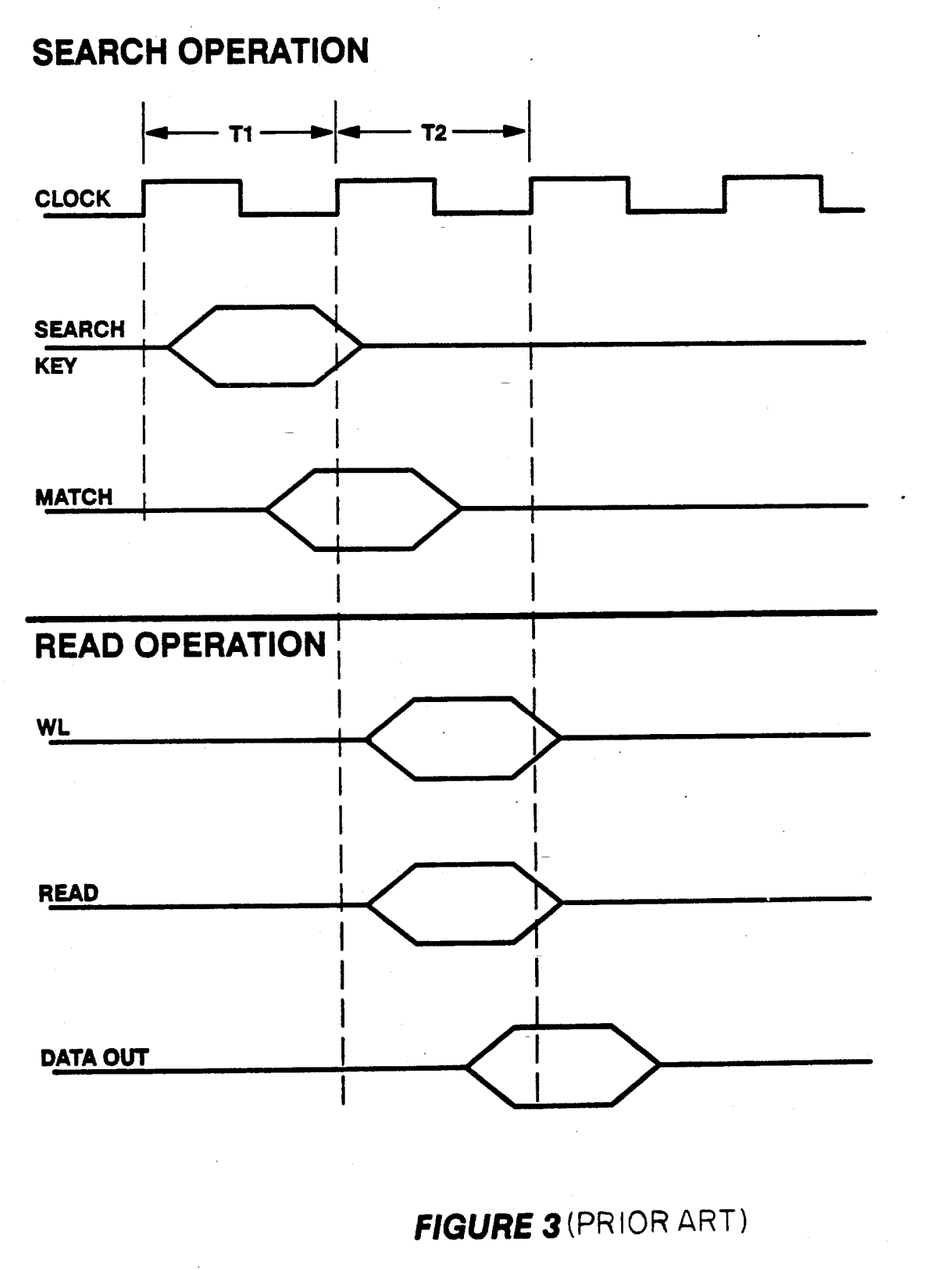
FIG. 3 is a timing diagram showing the functional operation of the conventional content addressable memory of FIG. 1A.

In the above illustration of FIG. 1B, it can be seen on the timing diagram of FIG. 3, that it would take 1 clock period to insert the search-key data, and a second clock period in order to do the matching for the output "match" lines. Likewise in order to Write data into a given location it would first be necessary to establish the address in the address word lines using 1 clock time and then to use a second clock time in order to write in the data by means of input lines D1, D2, D3, and D4.

It also may be noted in the timing of FIG. 3 that when a word line WL is activated by the address, for example, as the activation of line $202_b$ (which activates the second row of data forming a 4 bit word), it is possible to simultaneously activate the Read line 216, but however the output data on lines DO1, DO2, DO3, DO4, would not become forthcoming until the subsequent clock time had expired so that it would take at least 2 clocks for this to occur.

It would be most desirable for conditions to be such that the search and match operations could be accomplished in one clock time and also that the read and data out operations could be accomplished in one clock time thus insuring a faster and quicker set of operations for the access of data or for the writing in of data or for the searching of data to be read out.

This improved condition can be realized by the architecture of the CAM system described hereinafter.

The "standard type" of CAM cell 300 is seen in FIG. 2 as being composed of transistors having certain functions. The area of transistors marked TC is the conventional flip-flop set of transistors in which one pair of transistors involves the "set mode" while the other pair of transistors involves the "reset mode". The area marked C1 involves 2 transistors which provide the conventional compare operation for the "reset mode" while the area marked C2 provides for 2 transistors which provide the conventional compare operation for the "set mode".

Again as seen in FIG. 2, the bit lines 206 and 208 are the input/output lines for the reading-in and writing-out of data. The word line address line WL is designated as 202 in order to provide an output address while the match line 204 is the hit line which is output as 205.

Now referring to FIG. 3, the timing operation for a Search and for a Read of the content addressable memory, CAM, (shown in FIGS. 1A and 2) will be observed. The first line of FIG. 3 shows the clock signal with the first clock being designated as T1 and the second clock being designated as T2. The activity of the Search-key occurs in the area of the first clock with a slight overlap into the second clock. The execution of the "match" operation occurs toward the end of the first clock mainly into the second clock.

For a "Read" operation the word line address on line 202 (FIG. 1A) is seen to function shortly after the beginning of the second clock in that the read lines signal activation occurs shortly after the initiation of the second clock. It will be noted that the Data-Out on line 226 of FIG. 1A does not occur till the end portion of the second clock and on outward into the third clock. Thus it is seen that more than 2 clock periods are necessary in order to provide the functions of search-compare, match ("hit") operation; and then the action of the word line address with Read activation and Data readout, then takes additional clock time.

Thus in the standard applications for a content addressable memory, operation requires that there first be a search compare operation to see if a particular data word exists in the CAM. And then there is the need to read the contents of the CAM, (assuming that a hit or match has occurred), resulting in a second operation for read out of the word which requires an additional system clock.

As will be noted in FIGS. 1A and 2, the operation of the Search-key/Data-in, on line 222, the Data-Out on line 226 are seen to use the same bit lines (206, 208) for the inputs and outputs. Because of this, the operations of (i) data in; (ii) data out or (iii) Search key cannot occur simultaneously during the same clock cycle.

Figure 4:
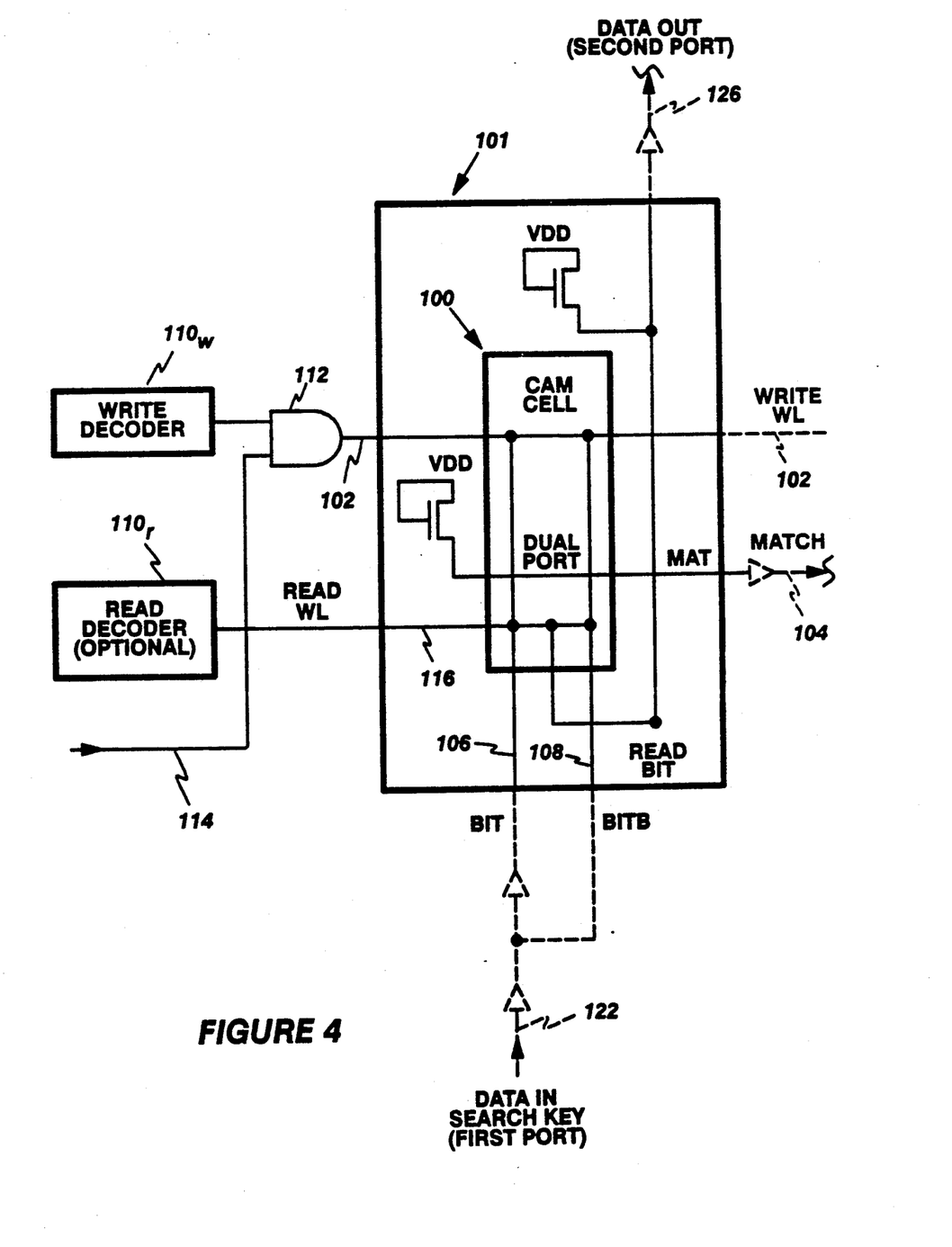
FIG. 4 is a block diagram of a dual ported content addressable memory which uses a new architecture.

Thus in the operations of the standard conventional CAM 101 regarding a selected memory location, as seen in FIG. 4, the Search key data is sent through the bit lines (106, 108) to be compared with the contents of a selected address. If the Search key data in matches the contents of a selected address, this results in a match or hit signal coming out through line 104 of FIG. 4, comparable to output 205 on line 204, FIG. 1.

If the contents of the CAM do not match the Search-key data then the contents of the selected, address of memory is read to the "Data-out" line 126 of FIG. 4 (comparable to 226 of FIG. 1A) for further evaluation.

As will be seen with reference to FIG. 3 in the timing diagram, the Search-Compare and Read operations together require at least 2 clock cycles to complete. In a 16 megahertz system, this would involve a "time loss" of 62.5 nanoseconds.

An object of the present disclosure is to obviate the extended time-loss period and eliminate need for multiple clock cycles in accomplishing the Search-compare and data Read actions. The present system will be seen to permit the execution of a Search-Compare-Read operation in the very same cycle.

SUMMARY OF THE INVENTION

An enhanced architecture is provided for a content addressable memory which permits a considerable shortening of operation time in that the compare/read operation can be accomplished in the same clock cycle.

A dual ported content addressable memory is provided which includes a first and second word line and a READ circuitry unit (sense amplifier) which permits the near simultaneous operation for the compare and read operation to occur within one clock cycle.

A newly organized CAM cell is provided with separate lines for Data-In/Search operation and for Data-Out Operation such that Data-In and Data-Out can occur concurrently within the same clock cycle.

Two transistors are added to each CAM cell in the CAM array so that each CAM cell has a Data-Out port in addition to the Data-In port.

An additional word line for addressing the CAM array on "Read Operations" is provided so that a first word line addresses the CAM array for "Write" operations and second word line addresses the CAM array for "Read" Operations.

The two ports, Data-In and Data-Out, are separate so that no sharing or interference occurs between the two ports and so that the Search-Compare action and the Read action can occur concurrently in the same clock cycle.

DESCRIPTION OF PREFERRED EMBODIMENT

FIG. 4 shows a schematic drawing of the improved CAM array 101.

The CAM array 101 supports a first word line 102 designated as the Write Word line. Additionally there is provided a second word line 116 designated as the Read Word line. These two word lines are independent of each other and function concurrently to address a row of CAM cells in order to write in data, and to search rows of CAM cells to find a "co-incidence" of data (hit =data-in coincides with data residing in a row of CAM cells) while also reading out the data on a separate Data-Out port 126.

The architecture of the CAM cell array 101 permits the use of two different addresses which are decoded by the Write decoder 110$_W$ and the Read decoder 110$_r$.

Control line 114 which feeds AND gate 112 insures that the Write address and the Read address do not occur at the same instant where a conflict might occur.

As noted in FIG. 4, the first port via line 122 is the Data-In/Search port. The second port is the line 126 which is the Data-Out port.

During the Search-Key operation, the incoming data will be compared with the data in each row of cells. If a "match" occurs, then the hit line 104 (for that particular row of data) will be activated to inform an external logic unit that a hit has occurred.

Figure 5:
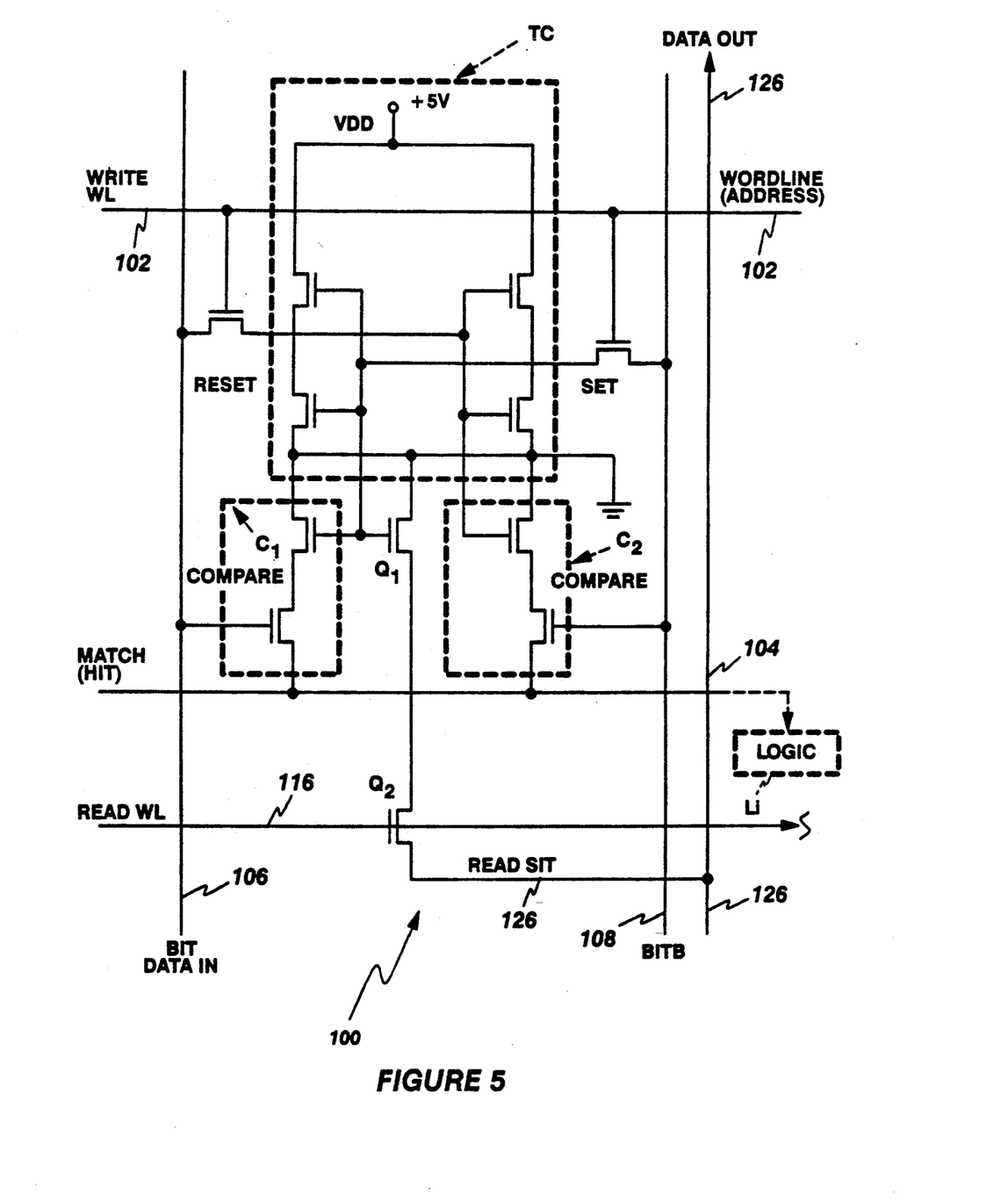
FIG. 5 is a schematic representation of the transistors and connecting lines of the new dual ported CAM cell.

Referring to FIG. 5 there is seen the improved architecture for the dual port content addressable memory cell 100. The conventional group of transistors designated TC refers to the standard set and reset flip-flops. The areas designated C1 and C2 represent the standard comparison circuitry. The write word line 102 is seen connected to the set and reset flip-flops in the area TC. The match (hit) line 104 is seen connected to the comparison circuitry of C1 and C2 to provide an output on 104. The Read word line 116 provides for addressing a row of CAM cells during the Read operation. It will be noted that two transistors Q1 and Q2 have been connected to the set-reset flip-flops and the first comparison circuitry C1 in order to provide a "Read-Bit" line 126 which provides the outport port (second port) separate from the data-in lines 106, 108.

As seen in FIG. 5 the transistors Q1 and Q2 are added to each of the memory cells of the array which forms the content addressable memory. Thus, in each memory cell the transistors Q1 and Q2 form a DATA-OUT port for Read-Out and this is labeled as the second port 126. The gates of the transistors Q1 and Q2 are controlled, respectively, by the contents of the flip-flop transistor cells and the Read word line 116 (READ-WL). The transistors Q1 and Q2 operate as pull-down devices of the read bit line 126 (READ-BIT). Thus the capacitance of the read-bit line 126 cannot affect the contents of the cells or the gate capacitance of Q1. Thus the READ function is a very stable operation.

The Data-In port, line 122 of FIG. 4, and the data-out port 126 are seen to be separate ports which do not have any sharing function or interfering functions between the two of them.

Thus in the presently described configuration, the "READ" and the "SEARCH" functions can now be performed simultaneously and there is no need for a Read control signal.

Additionally as seen in FIG. 4, the dual port content addressable memory shown therein is capable of having separate decoders for the Write enable selection and for the Read enable selection. These are shown as the Write Decoder 110$_w$ and Read Decoder 110$_r$.

FUNCTIONAL OPERATION

Referring to FIGS. 4 and 5 which indicate the CAM cell 100 (FIG. 5) and the content addressable memory 101 array of FIG. 4, which uses a multiple lattice of CAM cells, (rows of CAM cells) it will be seen that the contents of a selected memory address is read out on the Data-out line 126.

The Search key data is sent on in through the Data-In lines 122 FIG. 4 (through the bit lines 106 and 108 FIG. 4) to be compared with the contents of a selected address residing in some row of the content addressable memory 101. If a match occurs, to develop a "true" signal, this means that the Search key data input on line 122 and the contents of one row of the content addressable memory 101, are "identical", therefore aborting the evaluation but activating the hit line 104 for that particular row of CAM cells. On the other hand, if the match on line 104 is false, then a "miss" condition signal is indicated.

Figure 6:
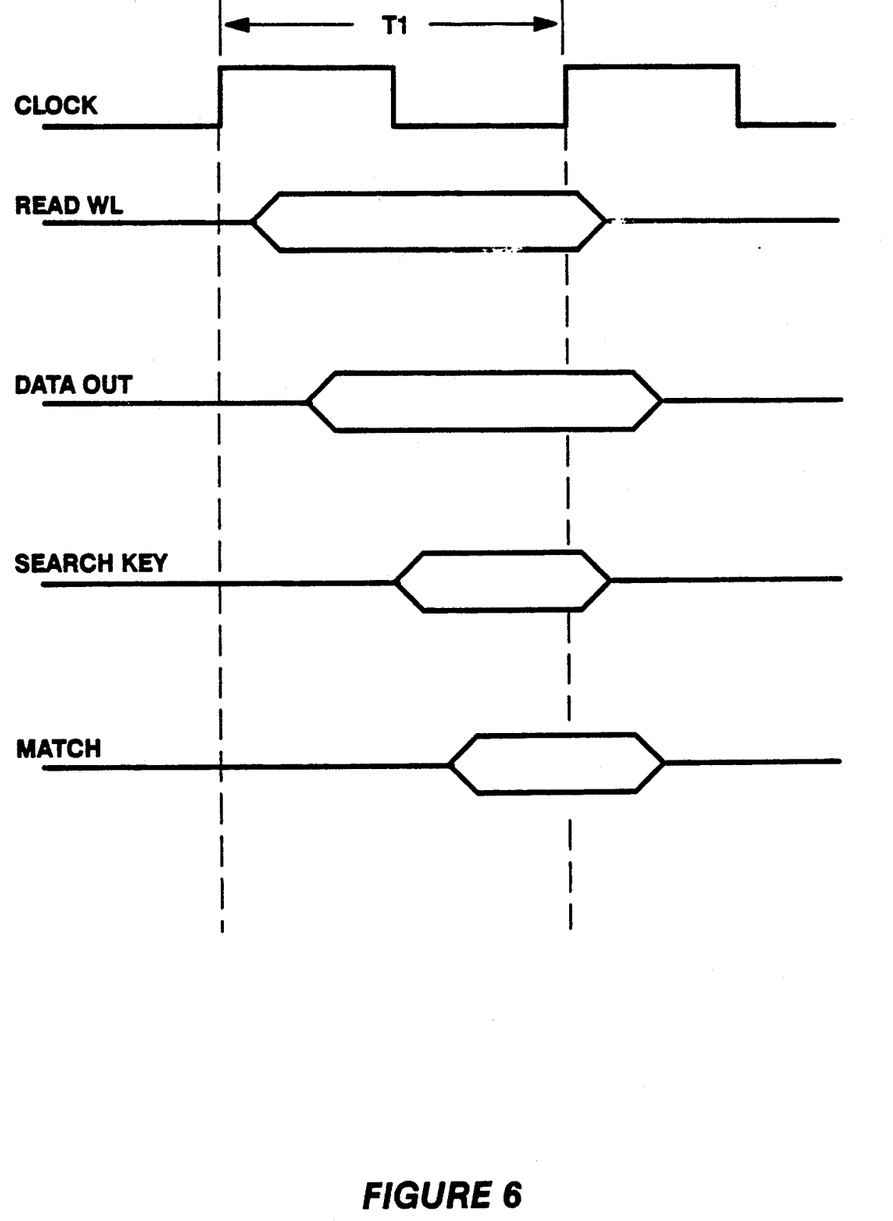
FIG. 6 is a timing diagram showing the operational features of the new dual ported content addressable memory.

Thus, as will be seen in the dual port CAM timing diagram of FIG. 6, during the actual single clock cycle designated T1, there is seen the operation of the Read word line 116 where the read decoder 110$_r$ (FIG. 4) provides an address signal through transistor Q2 (FIG. 5) which functions during the first clock cycle.

Then in FIG. 6, it is seen that shortly thereafter, the Data-Out-Line 126 (Read Bit FIG. 5) operates to allow data to be output and during this time, the Search-Key of line 122 (FIG. 4) and bit lines 106 and 108 (FIG. 5) operate to enable the match (hit) line 104 (thru C1 and C2) so that the Search-key and the match lines are functioning through most of the first clock cycle, T1, enabling the Data-Out-Line 126 to output the required data throughout the first clock cycle.

Thus the Write enable signal (Write WL102) and input port bit line 106 (and its complement 108) can operate concurrently in one clock cycle to write data into the memory array.

Also the search input signal on the input port bit line 106 (and its complement 108) can operate concurrently in one clock cycle, to search data in the memory and activate the match line 104 to designate a "hit" (coincidence of memory data).

Likewise, the Read enable signal (Read WL 116) can operate concurrently with the output port line (126 FIGS. 4 and 5), in one clock cycle, to Read-out the data residing in an addressed row of cells.

Thus it is possible in one clock cycle to search a data location, read it out on the output port 126 and also put out the Match signal on line 104 to Logic L$_1$.

Presented herein has been an improved content addressable memory which permits "concurrent" functioning of:
(a) Write data into a selected address (row of CAM cells); or
(b) Read data from a selected address;
(c) Search for coincident data in the CAM array and the output of a hit signal (Match) if coincident data is found in a row of cells.

Thus (b) and (c) involving Search-Match and Data Readout (Read WL) can be executed in one clock cycle, thus providing for doubling speed of operation of a computer system and consequent saving of time required to finish processing cycles.

The dual ported content addressable memory array using the newly organized CAM cells described herein, can be especially efficacious when used as a cache unit in a processor such that address-data residing in the array can be used to directly access information data in an associated RAM which becomes immediately available to the processor without the relatively long delays involved in accessing the information data from an associated main memory.

While a specific embodiment of the invention has been described herein, it should be understood that the invention is encompassed by the following claims.

What is claimed is:

1. A memory cell for use in a content addressable memory array comprising:
(a) first transistor means for holding a set bit signal and its complement reset bit signal;
(b) second transistor means for comparing an input search-match signal bit with said set bit signal and its complement reset bit signal;
(c) write line means, when activated, for enabling said first transistor means during a Write operation to insert the set bit signal;
(d) first input port means for inserting said search-match signal bit into said first transistor means;
(e) second output port means for output of said set bit signal from said first transistor means during a Read operation said second port means including:
(e1) third transistor means for gating said set bit signal, from said first transistor means, to a data output line which is entirely separate from said first input port means, and including:
(i) a first gating transistor activated by said second transistor means;
(ii) a second gating transistor activated by a read word line means;
(f) match line means for output of a match signal when said search-match signal bit corresponds to the set bit signal residing in said first transistor means;
(g) said read word line means for enabling said second gating transistor to convey said set bit signal to said data output line.

2. The memory cell of claim 1 wherein said signal bits on said first input port means and said second output port means are enabled to execute a Read operation and a Search-Match operation concurrently within one clock cycle.

3. The memory cell of claim 2 wherein said input search-match signal bit can seek a match to the set bit signal residing in said memory cell, and also output, during said one clock cycle, a hit signal when the match occurs.

4. The memory cell of claim 1 wherein said first port means can function to write in a set bit signal into said first transistor means.

5. The memory cell of claim 1 wherein said first port means inputs said search signal bit while said second port means provides an output signal bit and said match line means outputs a hit or miss signal bit concurrently during a single clock cycle.

6. A content addressable memory system comprising:
(a) an array of CAM cells arranged in "m" rows and each row having a "n" cells such that each row of "n" cells can hold data bits forming an n-bit word, each of said CAM cells including:
(a1) first transistor means for holding a set bit signal;
(a2) second transistor means for comparing an input search signal bit with said set bit signal;

(a3) first input port means for inserting said input search signal bit into said first transistor means;

(a4) second output port means for output of said set bit signal from said first transistor means during a Read operation, said second port means including:

(a4a) third transistor means for gating said set bit signal in a data out operation to an output data line which is independent and separate from said first input port means;

(b) first address means for selecting a given row of CAM cells during a WRITE operation to place an input data word into said selected row of CAM cells, said placement of said input data being executed in one clock cycle;

(c) second address means for selecting a given row of CAM cells during the READ operation to transfer out the resident input data word from the selected row of CAM cells, said transfer of said resident data word being executed in one clock cycle;

(d) third search means for searching each of said "m" rows of cells to seek a coincidence (match) between an input-search data word and a data word resident in a row of CAM cells, said search-match action being executed in one clock cycle;

(e) and wherein said Read and data out operation executes approximately concurrently with said search and match operation during said one clock cycle.

7. The memory system of claim 6 wherein said third search means includes;

(a) means for generating a coincidence signal output for external circuitry to indicate the row of cells having the resident data word which matched the input search-data word.

8. The memory system of claim 6 which further includes:

(a) first logic means for enabling the data bits to be read out of each addressed CAM cell during the READ operation.

9. The memory system of claim 8 which further includes:

(a) second logic means for enabling the writing-in of the input data words into each addressed row of CAM cells during the WRITE operation.

10. The memory system of claim 9 wherein said second logic means includes:

(a) means for enabling the input search data word for comparison with the data words residing in said "m" rows of CAM cells.

* * * * *